(12) United States Patent
Newman et al.

(10) Patent No.: US 6,534,159 B1
(45) Date of Patent: Mar. 18, 2003

(54) SIDE ALIGNMENT MARK

(75) Inventors: Thomas H Newman, Sunnyvale, CA (US); Norbert Kappel, San Jose, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/394,365

(22) Filed: Sep. 10, 1999

Related U.S. Application Data

(62) Division of application No. 08/867,837, filed on Jun. 3, 1997, now Pat. No. 5,956,564.

(51) Int. Cl.⁷ .................... H01L 23/544; G11B 5/127
(52) U.S. Cl. .................. 428/209; 428/195; 428/469; 360/313; 257/797
(58) Field of Search .................. 428/209, 195, 428/469; 257/797; 438/462; 360/313

(56) References Cited

U.S. PATENT DOCUMENTS

| | | | | |
|---|---|---|---|---|
| 4,338,620 A | | 7/1982 | Kawabe | 357/50 |
| 4,418,467 A | * | 12/1983 | Iwai | 29/574 |
| 4,479,830 A | | 10/1984 | Koshino et al. | 148/1.5 |
| 4,893,163 A | | 1/1990 | Rudeck | 357/40 |
| 5,002,902 A | | 3/1991 | Watanabe | 437/235 |
| 5,106,432 A | | 4/1992 | Matsumoto et al. | 148/33.2 |
| 5,270,255 A | * | 12/1993 | Wong | 437/194 |
| 5,300,797 A | | 4/1994 | Bryant et al. | 257/206 |
| 5,316,966 A | | 5/1994 | Van Der Plas et al. | 437/70 |
| 5,369,050 A | | 11/1994 | Kawai | 437/62 |
| 5,405,810 A | | 4/1995 | Mizuno et al. | 437/229 |
| 5,462,636 A | | 10/1995 | Chen et al. | 216/17 |
| 5,525,840 A | | 6/1996 | Tominaga | 257/797 |
| 5,786,267 A | * | 7/1998 | Haraguchi et al. | 438/584 |
| 5,847,468 A | * | 12/1998 | Nomura et al. | 257/797 |
| 5,861,320 A | * | 1/1999 | Shiranasi | 438/16 |
| 5,939,132 A | * | 8/1999 | Fujii et al. | 427/97 |

* cited by examiner

Primary Examiner—Deborah Jones
Assistant Examiner—Stephen Stein
(74) Attorney, Agent, or Firm—Allston L. Jones

(57) ABSTRACT

An apparatus in accordance with this invention includes an alignment mark that is formed in a substrate. The alignment mark extends across a dice line so that, upon dicing the substrate, the mark is exposed in the substrate's side edge. The mark is formed at a predetermined distance from a position at which a feature is desired to be formed on the substrate's side edge using a mask. Accordingly, the mark is a positional reference that can be used for highly accurate placement of the feature on the side surface of the substrate with the mask. Preferably, the mark is formed of metal or other material enhanced to a size that is readily detectable by an alignment system with which the mark is to be used. The invention also includes methods for making the alignment mark.

27 Claims, 12 Drawing Sheets

SIDE ALIGNMENT MARK

CROSS REFERENCE

This application is a divisional application claiming priority from U.S. Ser. No. 08/867,837 filed Jun. 3, 1997, which has issued as U.S. Pat. No. 5,956,564.

BACKGROUND OF THE INVENTION

1. Field of the Invention

This invention is directed to an alignment mark used to align a mask to form a feature at a desired position on a substrate. The invention is also directed to a method for making the mark.

2. Description of the Related Art

In the formation of a magneto-resistive (MR) thin-film head device, the head device is integrated into a substrate so that it extends across a dice line. Upon dicing the side edge of the substrate, the head device is exposed in the substrate's side edge. The substrate's side edge is polished and subjected to selective removal of portions of the substrate and device through ion milling or reactive ion etching, for example, to form a relatively narrow write gap bridge. With its narrow width, the write gap bridge can be used to write correspondingly narrow data tracks on a magnetic storage device such as a hard disk drive. The narrow width of the data tracks allows the tracks to be more closely spaced to increase data density of a magnetic storage device with which the head device is used.

The selective removal of portions of the substrate and head device to form the write gap bridge must be performed with high accuracy so that the write gap is properly positioned with respect to the portion of the MR layer used to read data. To perform the selective removal of material in the proper locations, a resist layer is formed and patterned to selectively expose the appropriate portions of the substrate and head device. The current practice to align the mask used to form the resist layer for ion milling, is to use a specific component of the head device as a positional reference for alignment. However, the ideal reference component for alignment in a MR thin film head is the MR contact layer, which is extremely thin in width, usually from 0.1 to 0.2 microns. Accordingly, the alignment system has great difficulty detecting the head device's reference component, if it is able to do so at all. Furthermore, by aligning to a component of the head device, the alignment system must be moved relative to the substrate before transfer of the mask pattern to the resist layer by exposure, thus introducing inaccuracy in the alignment of the mask used to form the feature. It would be desirable to overcome these disadvantages of previous devices and techniques for aligning features on the side surface of a substrate.

SUMMARY OF THE INVENTION

This invention overcomes the above-noted disadvantages. An apparatus in accordance with this invention includes an alignment mark that is formed in a substrate. The mark extends across a dice line so that, upon dicing the substrate, the mark is exposed in the substrate's side edge. The mark is formed at a predetermined distance from a position at which a feature is desired to be formed on the substrate's side edge using a mask. Accordingly, the mark is a positional reference that can be used for highly accurate placement of the feature with the mask. Preferably, the mark is formed of metal or other material with an enhanced size and appearance that are readily detectable by an alignment system with which the mark is to be used.

In a preferred configuration, the mark is formed with the same mask as that used to form a specific component of an integrated device in relation to which it is desired to form the feature. For example, the component can be the contact layers for the read gap of a thin-film head. The invented alignment mark is positioned at a predetermined distance from the component as determined by the mask. Like the mark, the integrated device is formed in the substrate and exposed in the substrate's side edge upon dicing and polishing the substrate. Preferably, the mark is formed together with the component at a relatively early step in the manufacture of the integrated device so that the mark's position is relatively unaffected by successive misalignments that generally occur over later steps in the integrated device's formation.

The invented alignment mark can be used as a positional reference for a mask to form a variety of different kinds of features. For example, the aligned mask can be used to pattern a resist layer to expose two window portions on opposite sides of a write gap bridge for a thin-film head device. Portions of the substrate and integrated device that are exposed by the windows, are removed by ion milling or reactive ion etching, for example. The selective removal of the substrate forms features that in this case are recessed areas positioned on opposite sides of a central write gap bridge of the thin-film head device. The write gap bridge is defined by the recessed areas so that it corresponds closely with the device's read gap composed of a MR layer situated between two contact layers. Because the alignment mark is formed together with the contact layer device components that define the read gap, the positioning of the write gap bridge can be controlled with the mark to closely align the write gap bridge with the read gap. By narrowing the width of the write gap bridge by the selective removal of material, and by properly aligning the read and write gaps relative to one another, the thin-film head device can read or write relatively thin, closely spaced data tracks on a magnetic storage medium such as a hard disk drive. The narrower width and closer spacing of the data tracks can be used to greatly increase the data density stored on the magnetic medium relative to conventional devices or techniques.

In addition to forming the recessed area features for the head device, the alignment mark can also be used to align a mask to form other types of features in relation to a head device or other types of integrated devices. For example, the alignment mark can be used to form an electrical connection to an integrated device such as transistor, diode, resistor, capacitor or other device exposed on the substrate's side edge.

A method of this invention includes a step of forming a mark and an integrated device component in a substrate with a first mask, and a step of forming a side edge of the substrate exposing the mark and the component. The invented method also includes a step of aligning a second mask defining a feature with the mark, and a step of forming the feature relative to the component with the second mask. To make the mark more visible to a mask alignment system used to form the feature, in the step of forming the mark, the mark can be enhanced in size. The mark enhancement can be accomplished in the invented method in different ways. For example, the step of forming the mark can be performed with a first resist layer that defines the mark and component, that is removed in locations proximate to the mark to eliminate resist wall residue produced in forming the integrated device. A second resist layer is formed to cover the integrated device and expose the mark, and material is selectively deposited on the mark to increase its size. For example, such mark deposition can be performed by plating or chemical vapor deposition, for example, both of which are well-known techniques. Alternatively, the first resist layer used to form the mark and component can be left intact. To clean the side walls of the first resist layer that define the contact layer components and the alignment marks, the side walls can be subjected to ion bombardment or a reactive ion beam. A second resist layer is formed that covers the integrated device, but exposes the mark. The material is selectively deposited on the mark to enhance its size, for example, by plating, chemical vapor deposition or sputtering. The remaining steps in the process for forming the integrated device are completed. The resulting mark is readily detectable by an alignment system to align a mask to form a feature at a desired position on the substrate's side edge.

The invented method can be used to accurately position a variety of different types of features on the substrate's side edge. For example, the integrated device can be a MR head, and the feature can be recessed areas defined by a resist layer on opposite sides of the MR head device's write gap. The invented method further includes a step of selectively removing portions of the substrate and head device exposed in the windows defined in the resist layer, to produce the feature recessed areas. The relatively narrow write gap bridge and its proper alignment to the read gap allows for correspondingly narrow data tracks to be written on a disk drive, for example, so that such tracks can be made relatively thin and more closely spaced, thus increasing the data density of the disk drive. The invented method can be used to form other types of features on the substrate's side edge. For example, the feature can be a conductive line for making an electrical connection to the integrated device. The conductive line can be formed by patterning a resist layer with a feature mask that is aligned with the mark.

Advantageously, the mark of the invented apparatus and method allows for highly accurate positioning of a feature that is desired to be formed on a substrate's side edge. This aspect of the invention is highly useful for a broad variety of applications, including the alignment of a mask for formation of recessed areas to reduce the width of a thin-film head's write gap or to form a conductive line for coupling to an integrated device on the substrate's side surface. Because the mark can be formed with a relatively large size in the invented apparatus and method, the mark can be readily detected and used as a positional reference by an alignment system for alignment of a mask used to form a feature on the substrate's side edge. In addition, because the mark can be accurately positioned with respect to a particular component of an integrated device by formation with the same mask, the mark is a highly accurate positional reference for a feature mask used to form a predetermined feature at a desired position with respect to the component.

These together with other features and advantages, which will become subsequently apparent, reside in the details of construction and operation as more fully hereinafter described and claimed, reference being made to the accompanying drawings, forming a part hereof, wherein like numerals refer to like parts throughout the several views.

DESCRIPTION OF THE PREFERRED EMBODIMENTS

Figure 1A:
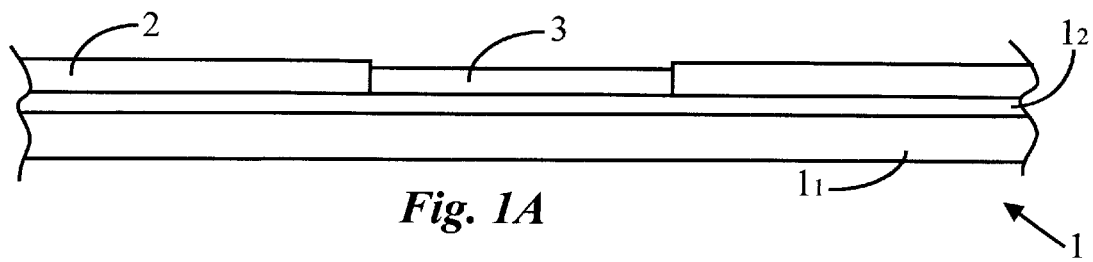
FIGS. 1A–1N are views of a first process for making and using alignment marks in accordance with the subject invention.
Figure 1B:
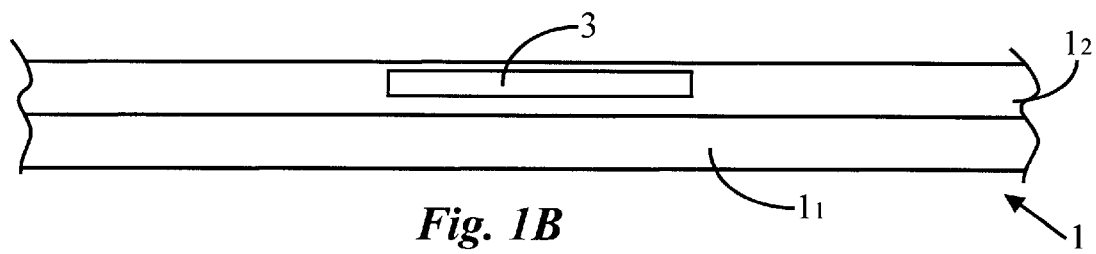
Figure 1C:
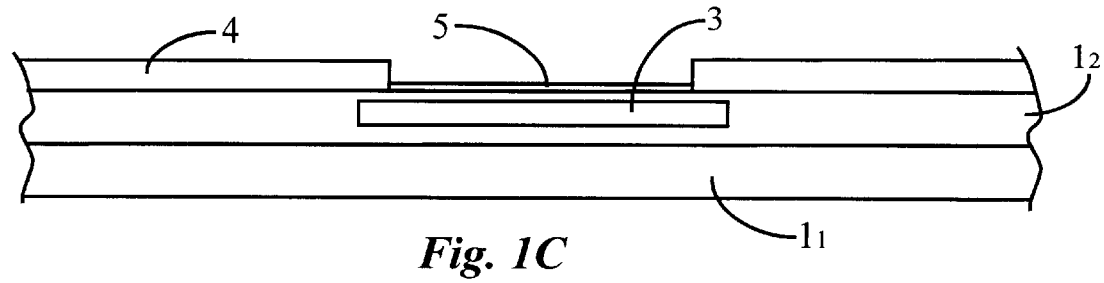
Figure 1D:
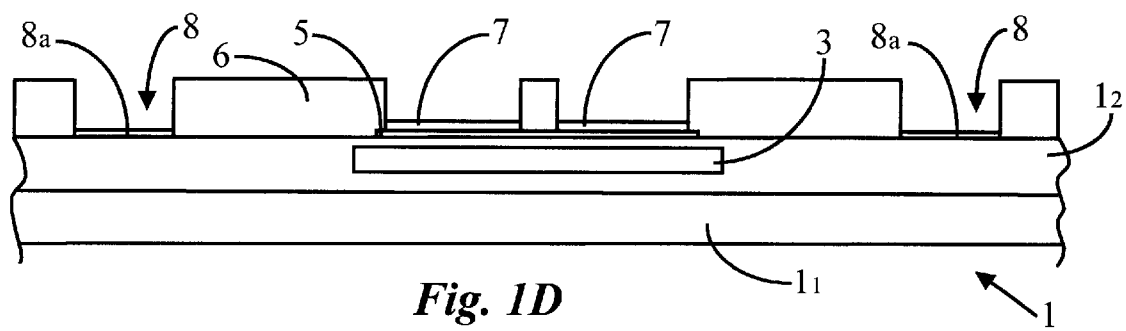
Figure 1E:
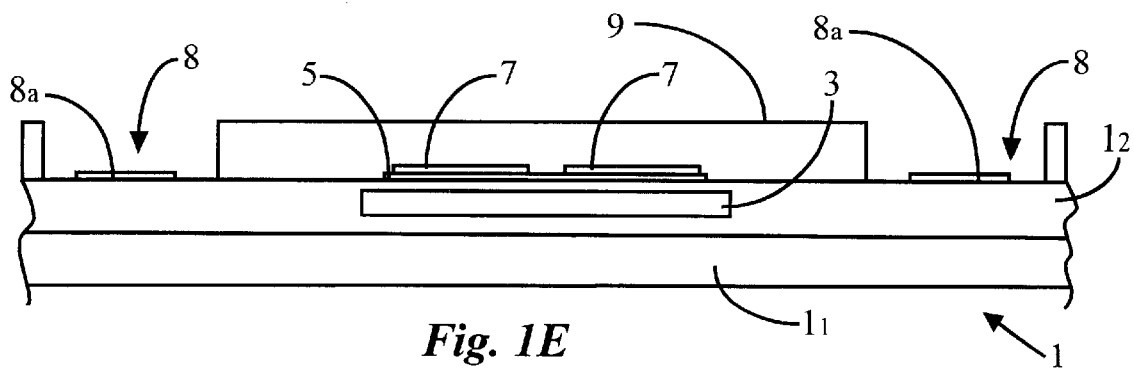
Figure 1F:
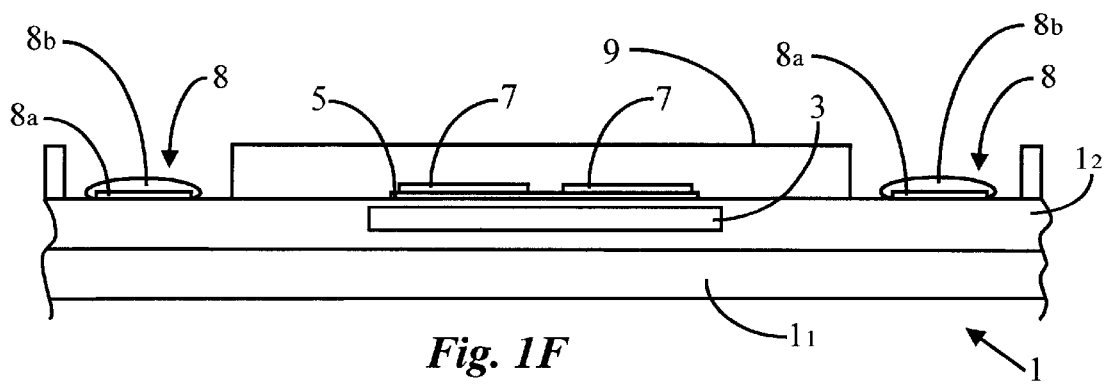
Figure 1G:
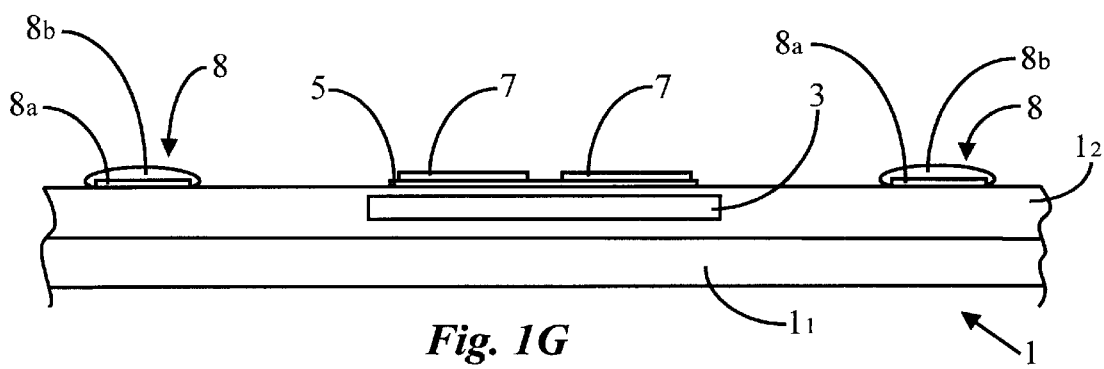
Figure 1H:
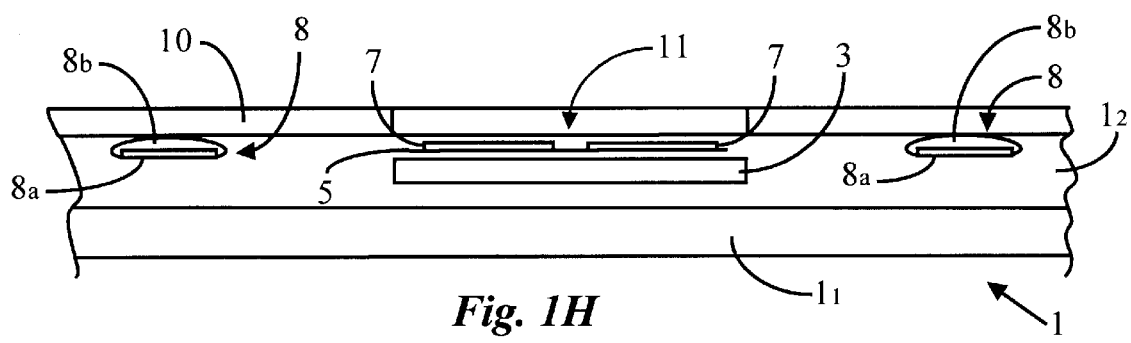
Figure 1I:
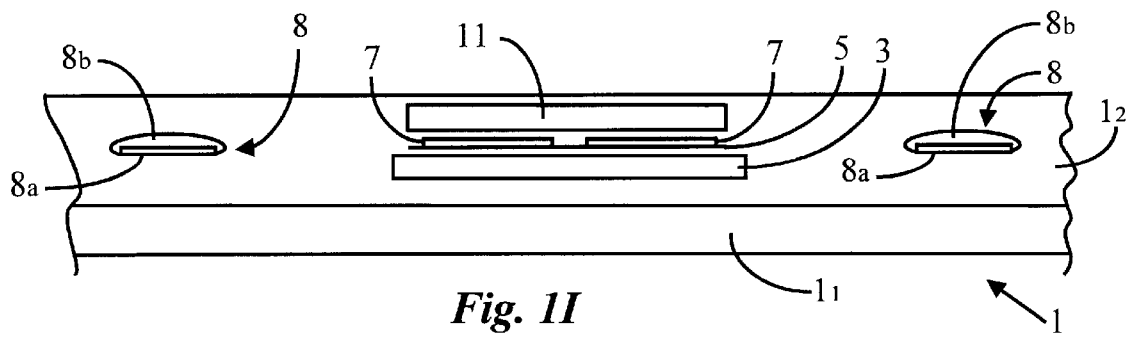
Figure 1J:
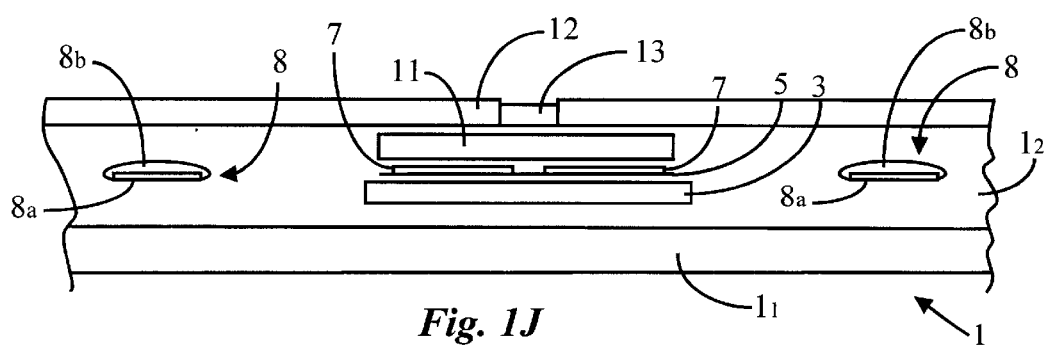
Figure 1K:
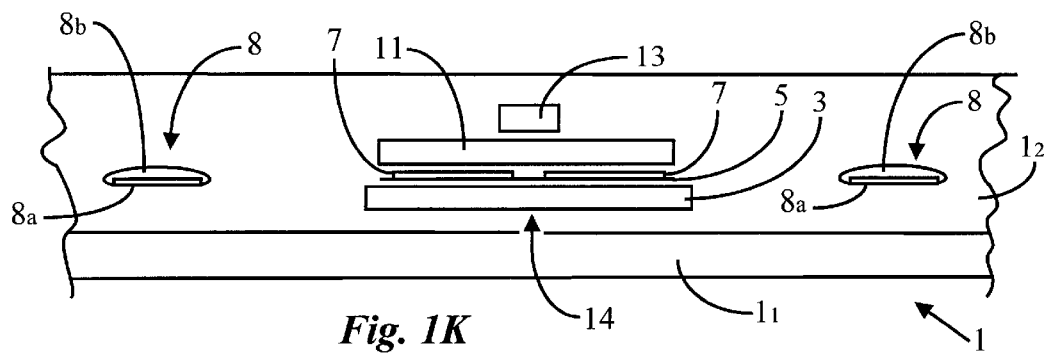
Figure 1L:
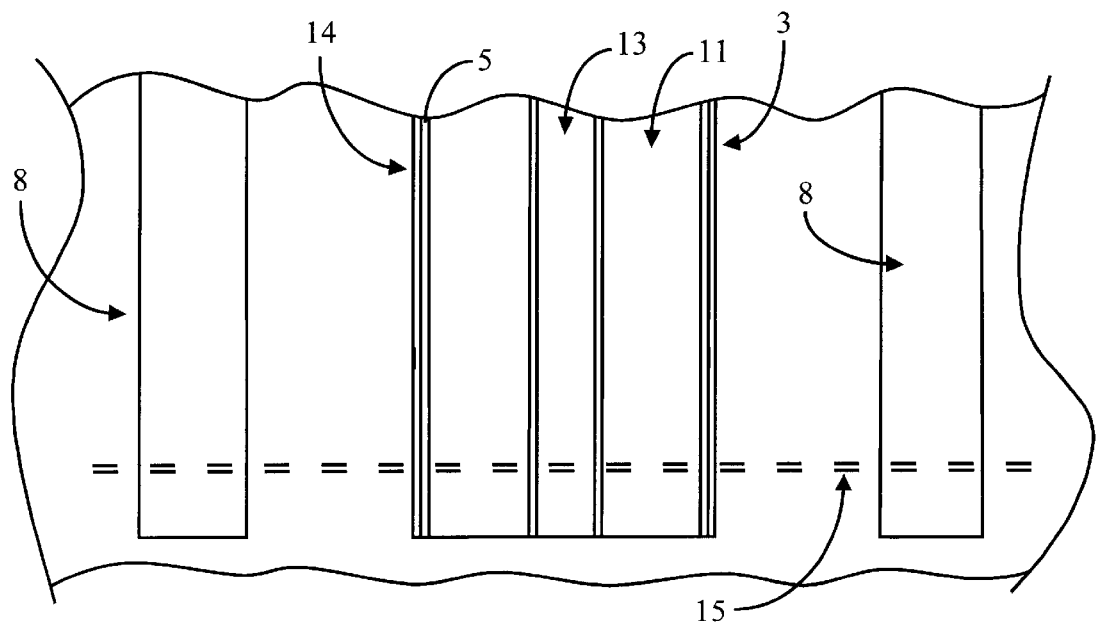
Figure 1M:
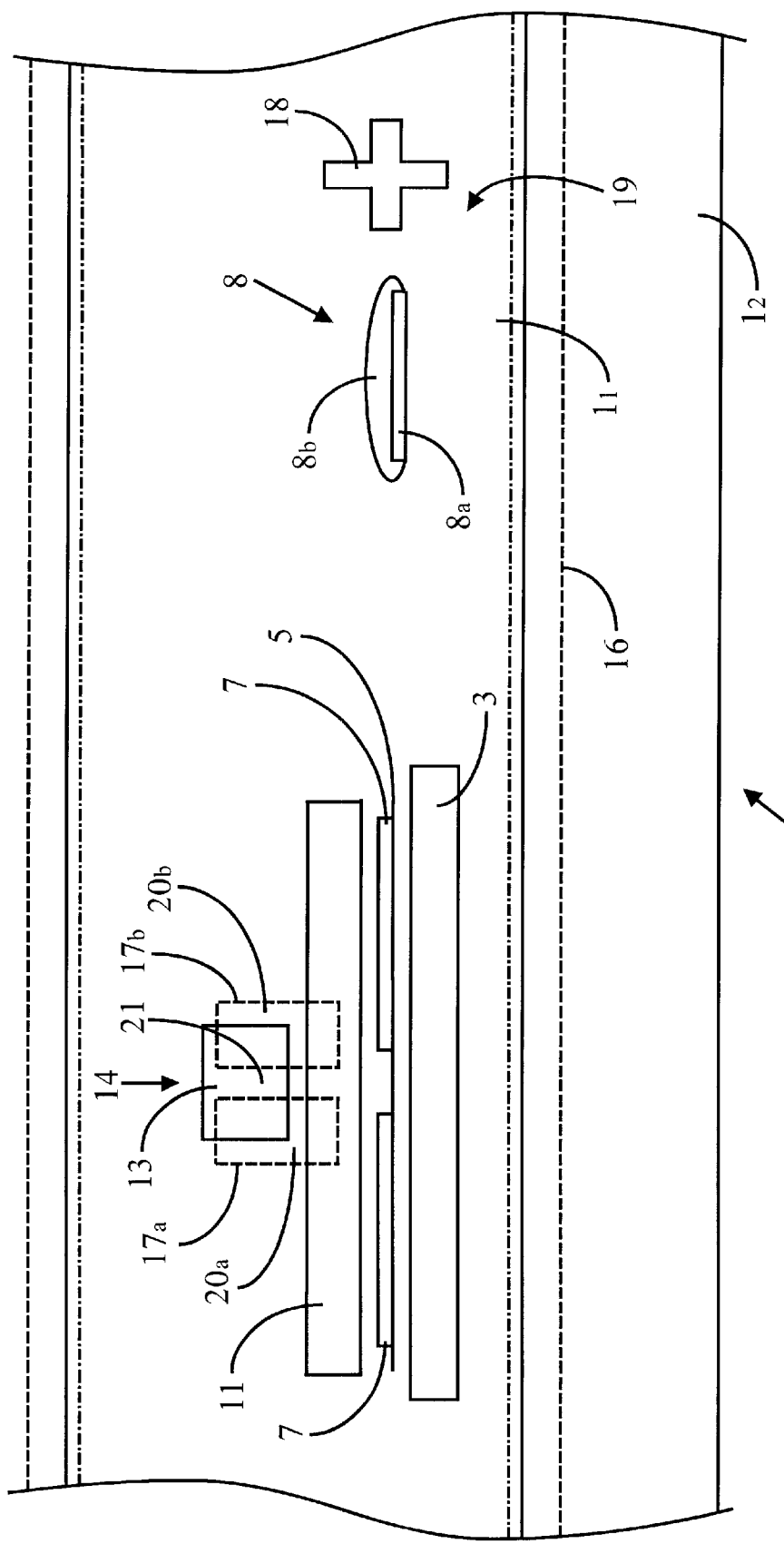
Figure 1N:
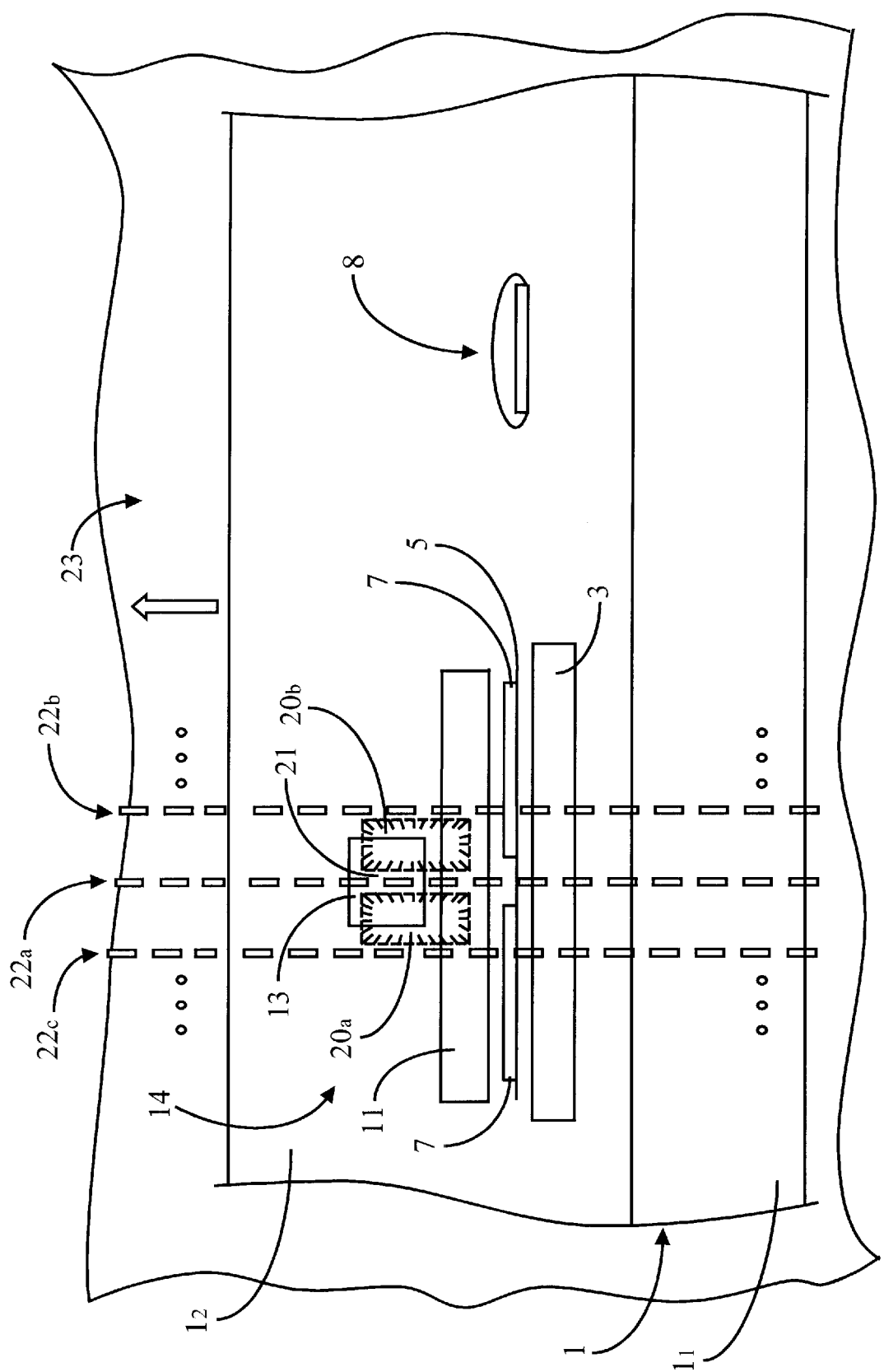

In FIGS. 1A–1N, the alignment marks of this invention are described in conjunction with the formation of recessed area features for the write gap of a thin-film head device. The description of the alignment marks in conjunction with the thin-film head device is given by way of example, and the extension of the invented alignment marks to align masks to form other types of features and integrated devices will be readily understood from the following description to be within the scope of the subject invention.

A first process for making and using alignment marks in accordance with this invention begins in FIG. 1A. In FIG. 1A, a substrate 1 has a surface upon which a resist layer 2 is formed. The substrate 1 can include an electrically-insulative plate $1_1$ and an insulative overlayer $1_2$. The plate $1_1$ can be formed of a sintered mixture of aluminum oxide ($Al_2O_3$) and titanium carbide (TiC). The insulative overlayer $1_2$ is formed on the plate $1_1$, and includes multiple layers of aluminum oxide ($Al_2O_3$) formed by chemical vapor deposition (CVD) or other technique. However, other appropriate materials and structures can be used for the substrate. The resist layer 2 is formed on the overlayer $1_2$, and is selectively patterned by exposure with a mask and development of the resist substance, to define an open window area. Depending upon the resist type, the resist layer 2 may require baking after development. As with other resist layers described herein, the resist layer 2 can be any particular type, positive- or negative-acting, exposed by one of a variety of lithography techniques. In most cases, optical lithography is suitable for selective exposure of the resist, although charged particle beam lithography can also be used with many types of resist. In the open window defined by the resist layer 2, a shield 3 is formed. The shield 3 is composed of a nickel-iron (NiFe) alloy or other material selected for its magnetic properties, for example, and can be formed by chemical vapor deposition (CVD), sputtering or other technique.

In FIG. 1B, the resist layer 2 is removed from the substrate 1 with a solvent, acidic solution or by oxygen plasma treatment, for example. The substrate's overlayer $1_2$ is grown by is CVD or other technique, to deposit a material such as aluminum oxide ($Al_2O_3$) to enclose the shield 3. In FIG. 1C, a resist layer 4 is formed on the substrate's surface and patterned to define a window over the shield 3. A magneto-resistive (MR) material (5) such as NiFe, NiCo/Cu, NiFe/Cu or other MR material, is deposited on the substrate through the window of the resist layer 4. The MR material can be deposited by sputtering, for example.

In FIG. 1D, the resist layer 4 is removed by solvent, acidic solution, or oxygen plasma technique, for example, and a resist layer 6 is formed and patterned on the substrate 1. In FIG. 1D, the resist layer 6 is patterned to define two windows overlying the MR layer 5, and two windows disposed on opposite sides of the shield 3 and MR layer 5. Two contact layers 7 made of electrically-conductive material such as metal, are deposited on the MR layer 5 by plating, CVD or sputtering, for example. Also, the conductive material is deposited in the windows positioned on opposite sides of the contact layers 7, to form layers 8a that are the foundation of the alignment marks 8 in the specific embodiment of FIGS. 1A–1N. Importantly, because the layer 8a is formed with the resist layer 6 patterned with the same mask as that used to form the contact layer components 7 with respect to which feature alignment is to be performed, the distance between the layer 8a and the contact layer components 7 is defined by the accuracy of only one mask pattern and the alignment accuracy of the lithography tool used to pattern the resist layer 6 and the resist layer that defines the feature. Therefore, by controlling the accuracy of the mask pattern, the contact layer components 7 can be spaced from the alignment marks 8 by a predetermined distance within a desired tolerance range using a lithography tool. Because the spacing of the contact layer components 7 relative to the alignment marks 8 can be controlled within a comparatively small tolerance, so also can the spacing of the features from the alignment marks be controlled within a relatively small total tolerance. The features can thus be formed at a desired position with respect to the component (s) within a relatively strict tolerance range. In the case of the thin-film head device, the features are generally required to be formed with respect to the contact layers 7 within a relatively small tolerance range of several tens of nanometers or less. In contrast, if contrary to the teachings of this invention the contact layer components 7 and the layer 8a were formed with separate masks, a plurality of mask patterns and respective alignment operations would be required, a situation that would result in the undesirable compounding of alignment errors and corresponding increase in the difficulty and/or expense associated with the lithography tool required to position features relative to the components. Thus, the alignment mark of the invented apparatuses and method are highly accurate positional references to the integrated device components, or more specifically, to the contact layers in the embodiments shown in FIGS. 1A–3. Because the features to be ultimately formed with the process of FIGS. 1A–1N must be aligned relative to the MR layer 5 extending across the gap between the two contact layers 7, the alignment marks 8 are strategically formed with the contact layers 7 to ensure accurate positioning of the features to be formed in the remaining steps of the first process.

In FIG. 1E, the resist layer 6 is removed by solvent, acidic solution, or oxygen plasma treatment, for example. A resist layer 9 is formed over the uncompleted integrated device including the shield 3, the MR layer 5 and the contact layers 7. The resist layer 9 is patterned to expose the alignment marks 8 through respective windows defined in the resist layer 9. The side walls of the windows of the resist layer 9 are disposed at a distance away from the sides of the layers 8a to allow for increased tolerance to misalignment of the mask used to form the resist layer 9. In FIG. 1F, a material 8b is deposited on the layers 8a to enhance the size of the marks 8 so that they can be more readily detected by an alignment system used to position a mask used to form the feature. The mark enhancement can be performed with a variety of selective deposition techniques, including CVD or a plating technique such as electroless plating with NiFe or Cu. Importantly, the size of the alignment marks 8 should be such that they can be readily detected by the alignment system used to align a feature mask to form the feature on the substrate's side surface. The required size of the marks in the vertical direction of FIG. 1E depends upon the capability of the lithography tool's alignment system that will ultimately be used to form the features. For many lithography tools presently available, the marks should be enhanced in size so that they are at least one micron thick in their smallest dimension.

In FIG. 1G, the resist layer 9 is removed, and in FIG. 1H, additional insulative overlayer material 12 is formed on the substrate 1 to enclose the MR layer 5, the contact layers 7, and the alignment marks 8. A resist layer 10 is formed on the substrate 1 and patterned to define a window overlying the shield 3, the MR layer 5, and the contact layers 7. A shared pole 11 is formed on the substrate 1 where it is exposed by the window of the resist layer 10. The shared pole It is composed of a conductive material such as metal that is deposited by plating, CVD or sputtering, for example. In FIG. 1I, the resist layer 10 is removed by solvent, acidic solution or oxygen plasma treatment, for example, and insulative material $1_2$ such as aluminum oxide ($Al_2O_3$) is grown on the substrate 1 to enclose the shared pole 11, using CVD or other technique. In FIG. 1J, a resist layer $1_2$ is formed on the substrate 1 and patterned to define a window that exposes a portion of the substrate overlying the shared pole 11. In the window defined by the resist layer 12, a conductive material such as a metal deposited by plating, CVD, sputtering or other technique, is formed to produce a top pole 13. In FIG. 1K, the resist layer $1_2$ is removed and the substrate's insulative overlayer $1_2$ is grown by CVD or other technique to deposit a material such as aluminum oxide to enclose the top pole 13 within the substrate. The shield 3, the MR layer 5, the alignment marks 8, the shared pole 11 and the top pole 13 together define an integrated device 14 that in the specific process of FIGS. 1A–1N is a thin-film head device.

FIG. 1L is a top plan view of the substrate 1 showing the alignment marks 8 and the integrated device 14. The substrate is diced with a diamond saw, for example, along a line 15 that traverses the alignment marks 8 and the integrated device 14. After dicing, the alignment marks 8 and the integrated device 14 are exposed in the substrate's side surface. The side surface of the substrate is polished to smooth the relatively rough surface left after dicing. The diced substrate containing thin-film head devices is sometimes referred to in this technology as a 'rowbar.'

In FIG. 1M, a mask 16 defining features 17a, 17b is aligned relative to the substrate's side surface using an alignment mark 8 as a positional reference. The mask 16 is preferably formed on a fused silica plate that supports a chrome layer and a resist layer that is patterned with a conventional beam or light lithography system with sufficient resolution and placement accuracy. The resist layer is developed and exposed portions of the chrome layer are removed by wet-etching to define the mask features 17a, 17b and mask mark 18. The substrate 1 and mask 16 are positioned in an alignment system capable of moving the mask 16 relative to the substrate's side surface. In any application in which the side edge of the substrate is relatively thin so that large mark patterns cannot be formed on the substrate's side edge, as it is in the thin-film head device application described herein, a machine vision system is generally required for the alignment system. The machine vision system does not require a large array of marks for alignment, but instead provides the capability to detect marks of any predetermined shape or a relatively small number of marks for use in alignment. The mask mark 18 is positioned at a predetermined offset from the alignment mark 8 to align the mask features 17a, 17b in the proper position relative to the integrated device 14, or more specifically, relative to the contact layer components of the integrated device that are formed together with the alignment mark using the same mask in FIGS. 1C and 1D. After alignment is achieved, a resist layer 19 (indicated by the dash-dot line in FIG. 1M) that is formed on the substrate's side edge, is exposed, typically by charged particle beam or light irradiation, to transfer the mask feature pattern to the resist. The substrate is removed from the alignment and lithography system, developed and processed to cure the resist. The resulting resist layer 19 thus exposes two windows 17a, 17b. The substrate is subjected to ion milling with ions projected with relatively high energies to form recessed areas 20a, 20b. Importantly, due to the use of the invented alignment marks, the recessed areas 20a, 20b can be formed with great accuracy to form the write gap bridge in alignment with the read gap defined by the MR layer 5 between the contact layers 7.

As shown in FIG. 1N, the two recessed areas 20a, 20b define a write gap bridge 21 situated between the two recessed areas. The bridge 21 is relatively narrow in width, and can be formed with a width of 1.5 microns or less with current technology. The bridge 21 can thus be used to write correspondingly narrow tracks 22 (three tracks 22a, 22b, 22c are shown in FIG. 1N) to a magnetic data storage medium 23. The medium 23 can be the magnetic disk of a disk drive, for example. In the typical operation of the thin-film head device, as the medium 23 is driven to rotate about its central axis, the substrate or rowbar 1 is radially disposed relative to the disk drive, and the magnetic surface sweeps under the head device in the direction indicated by the arrow in FIG. 1N. The write gap defined on the bridge 21 between the shared pole 11 and the top pole 13 is coupled to an external data write control device (not shown) that writes data to the data storage medium 23. The device's read gap is defined between the contact layers 7 that are coupled to an electric current supply (not shown) that passes current through the MR layer 5 of the read gap. As the read gap of the thin-film head device passes over the track 22a, the current flowing in the MR layer 5 is perturbed by the high- or low-logic orientations of the data track. The variations in the current flow in the MR layer 5 due to the high- and low-logic orientations of the data track 22a are detected by a detector (not shown) that extracts the data from the signal generated by the MR layer 5.

Figure 2A:
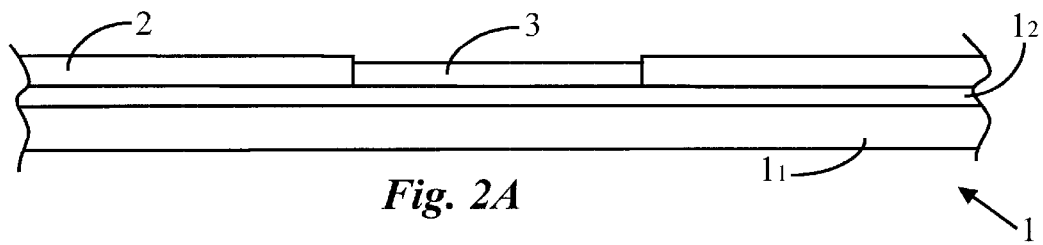
FIGS. 2A–2O are views of a second process for making and using alignment marks in accordance with the subject invention.
Figure 2B:
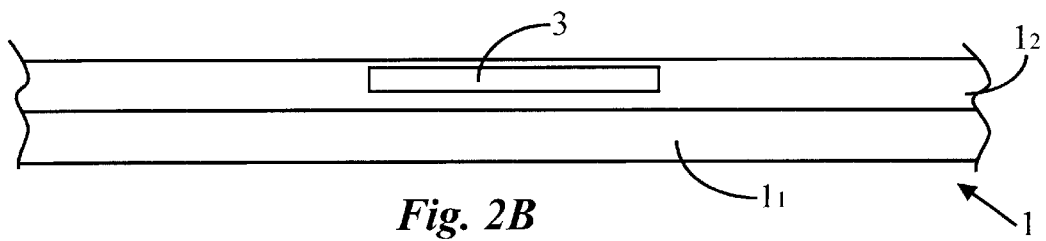
Figure 2C:
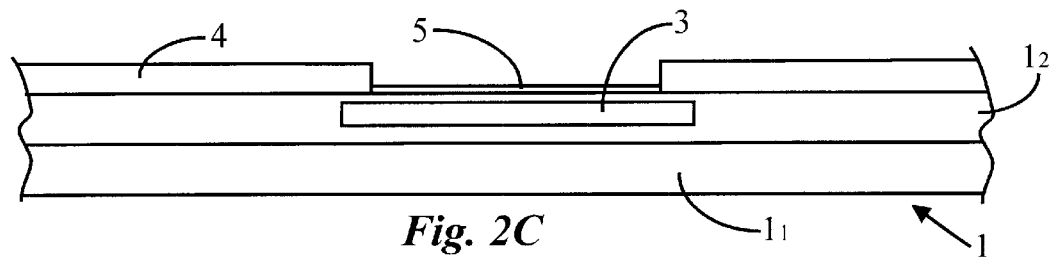
Figure 2D:
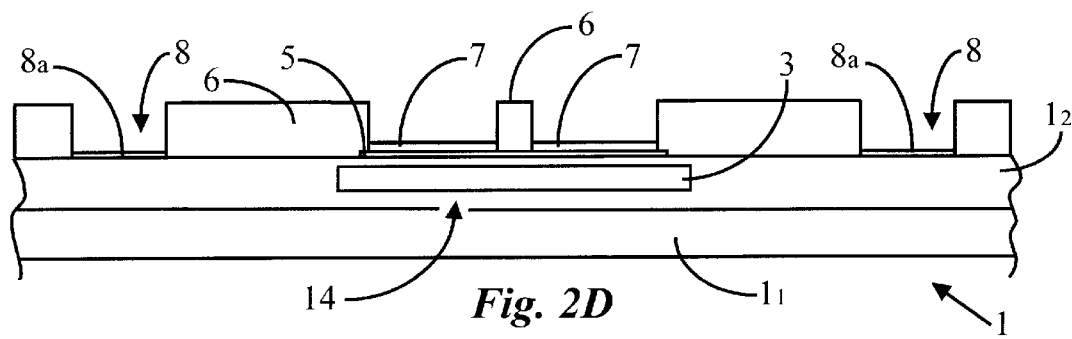
Figure 2E:
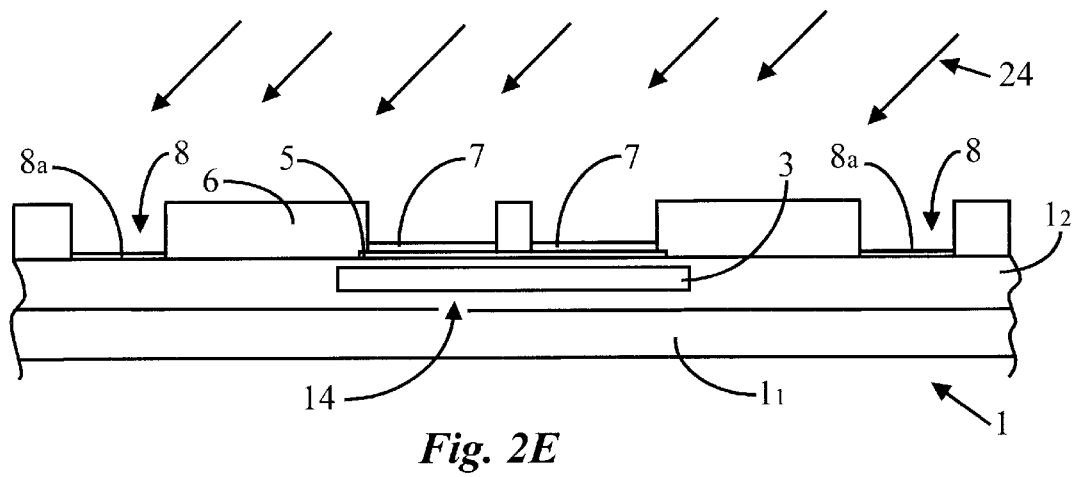
Figure 2F:
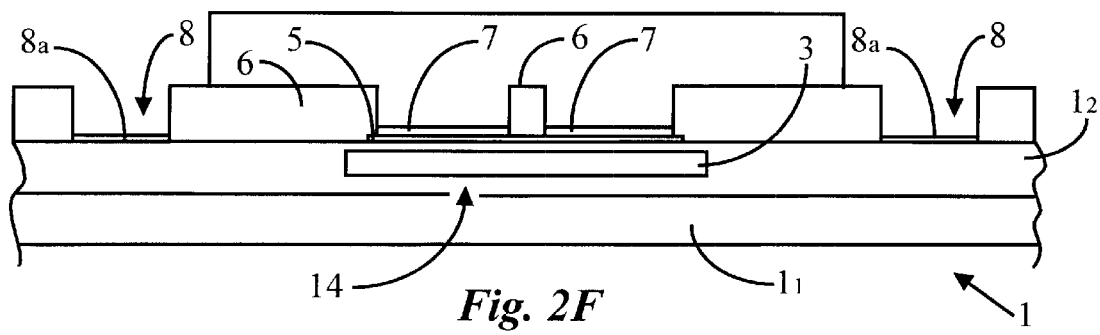
Figure 2G:
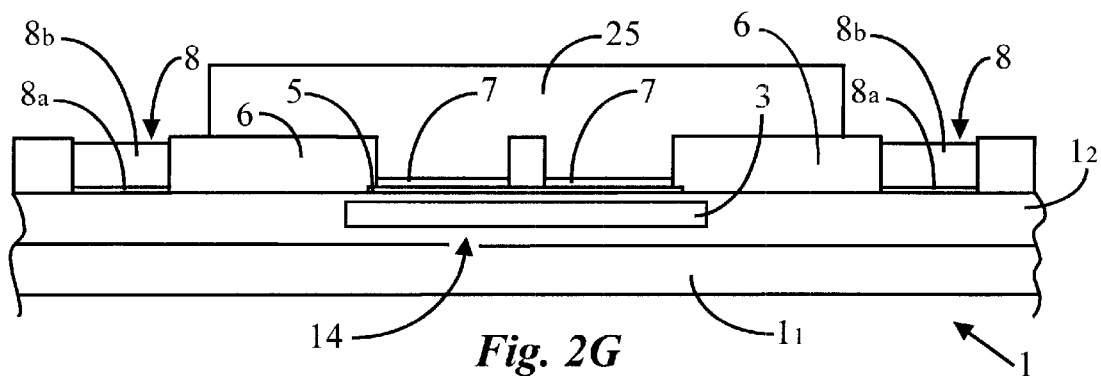
Figure 2H:
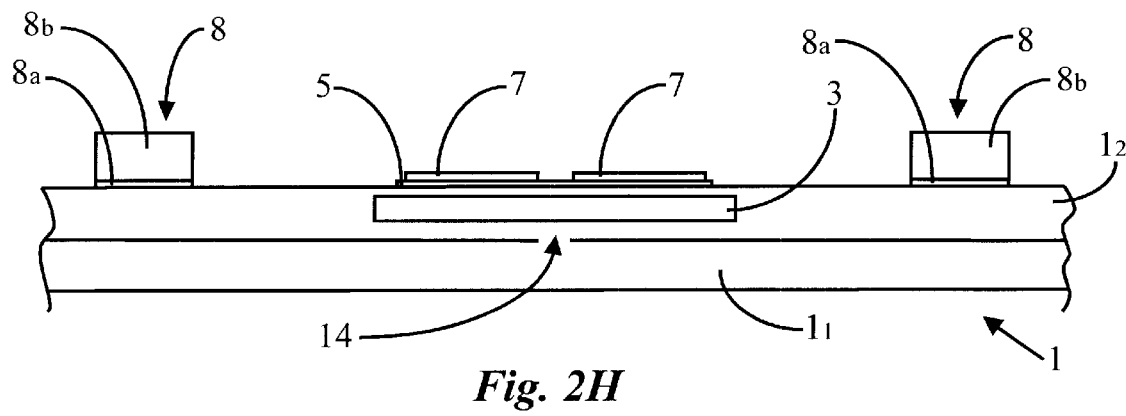
Figure 2I:
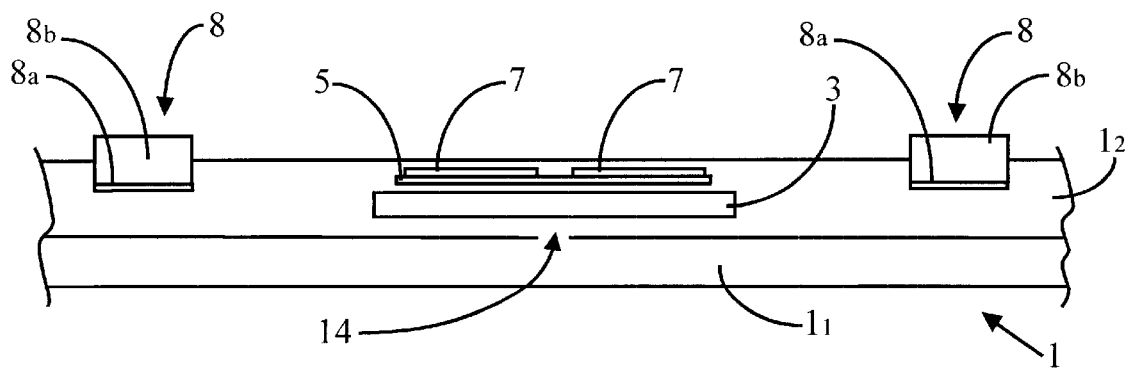
Figure 2J:
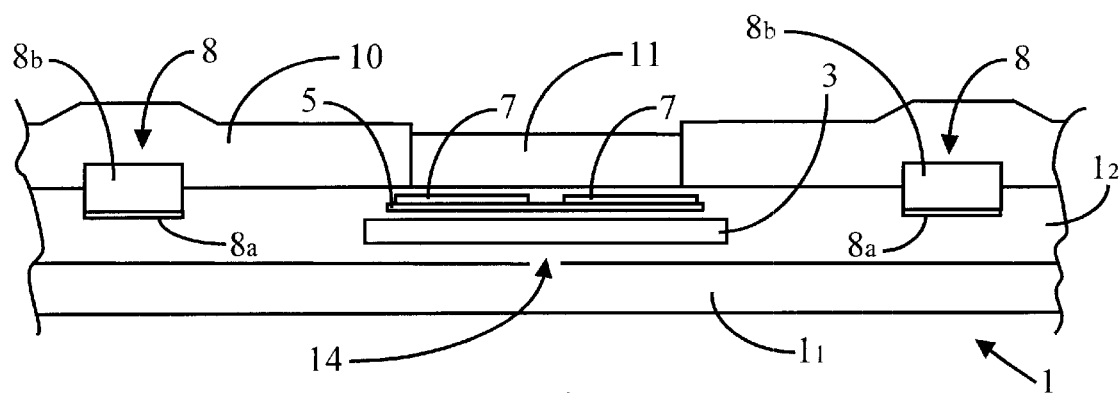
Figure 2K:
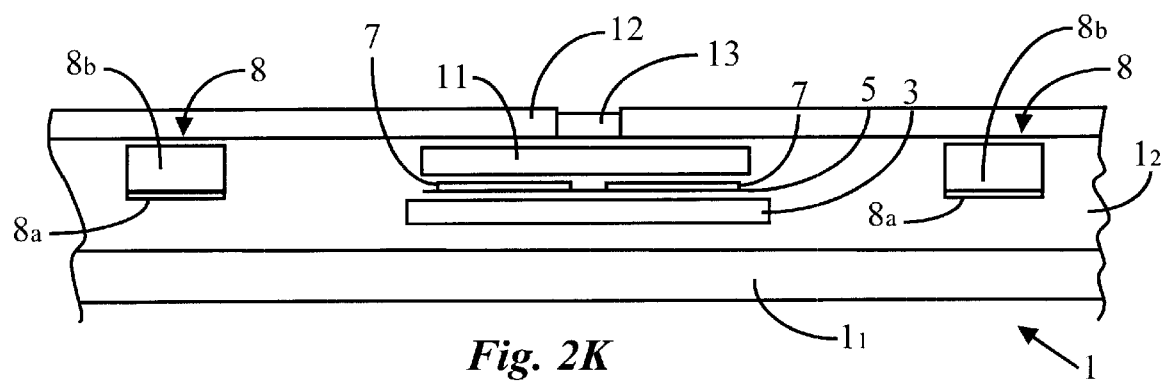
Figure 2L:
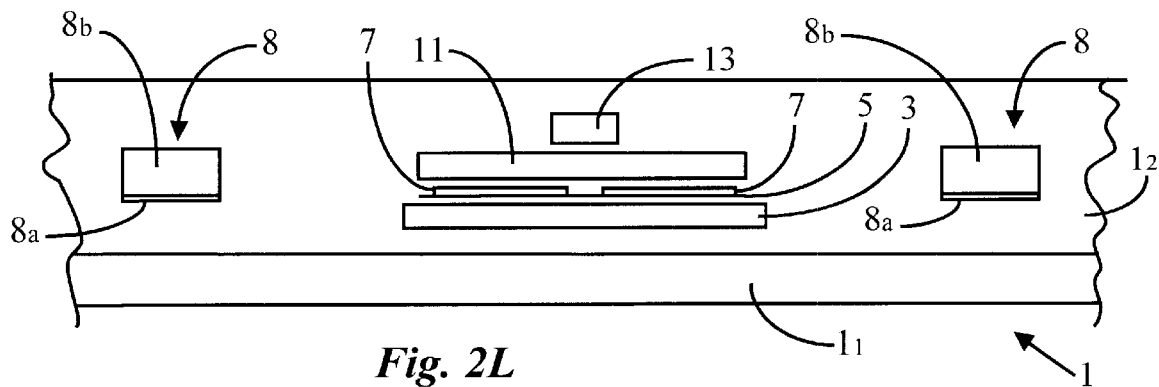
Figure 2M:
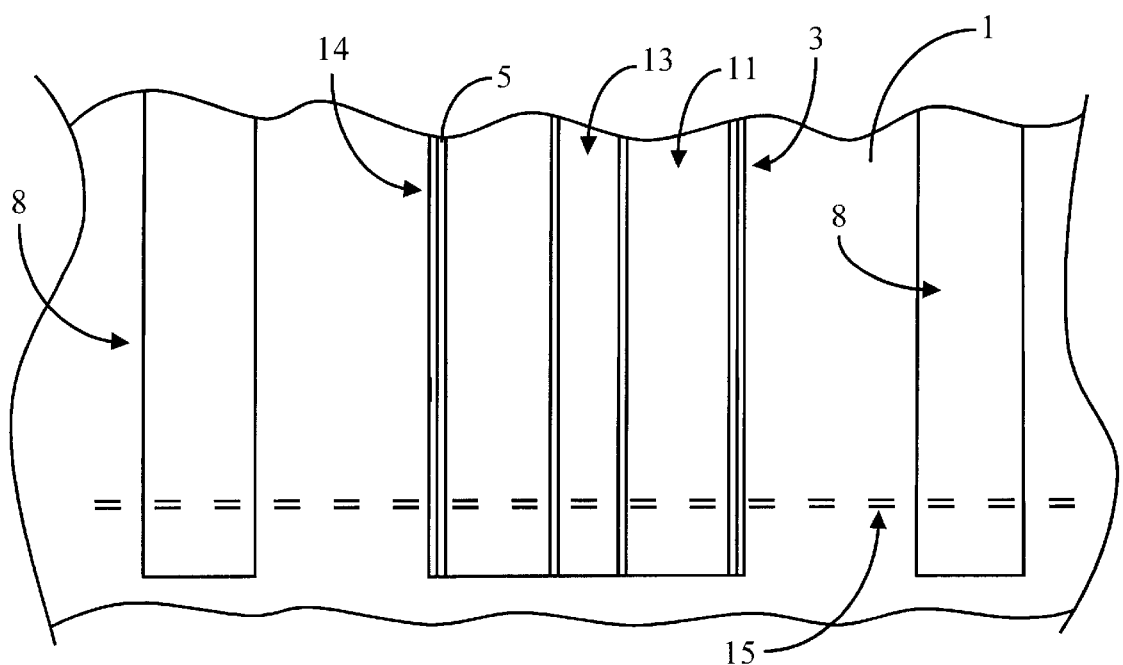
Figure 2N:
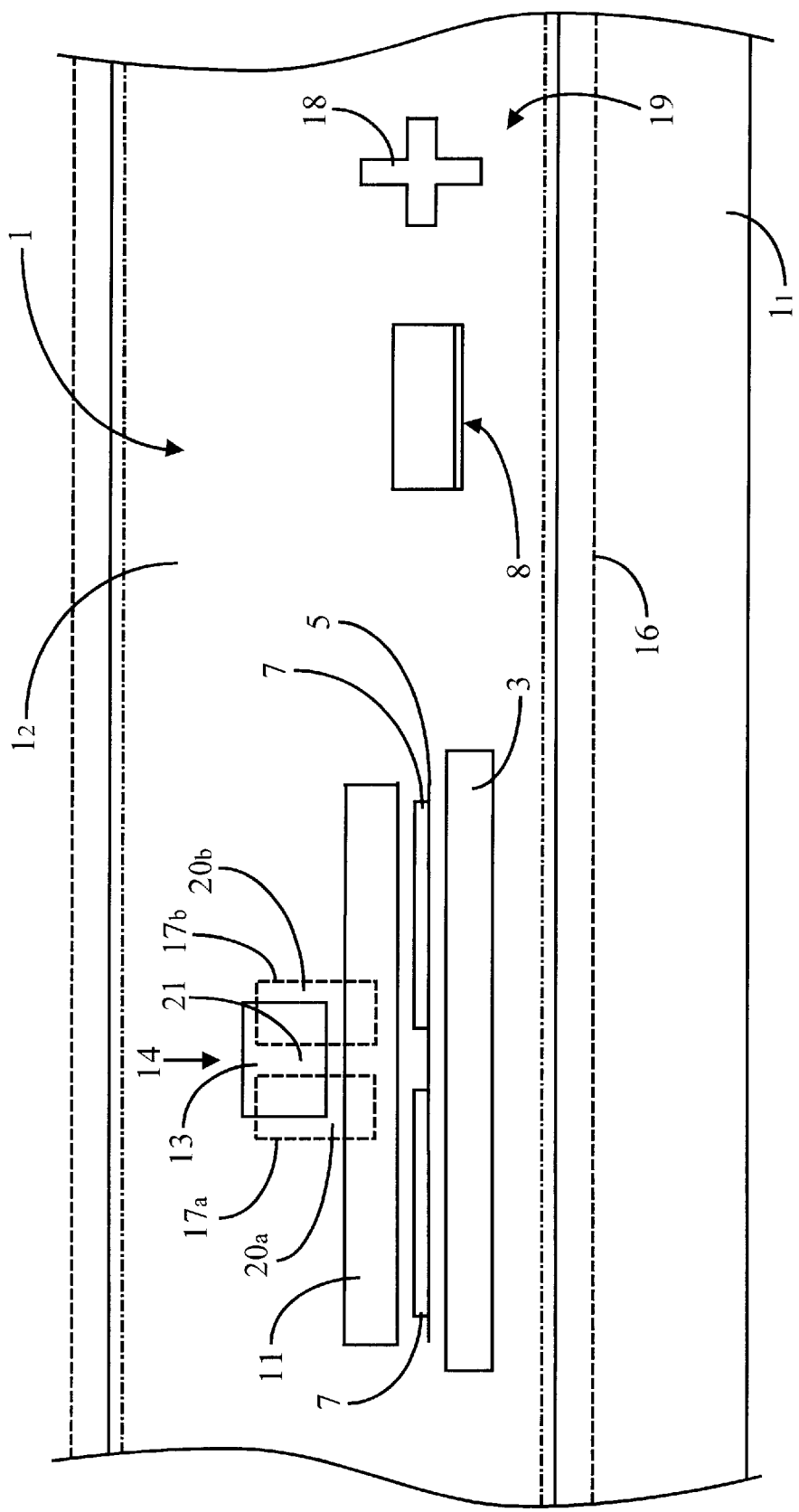
Figure 20:
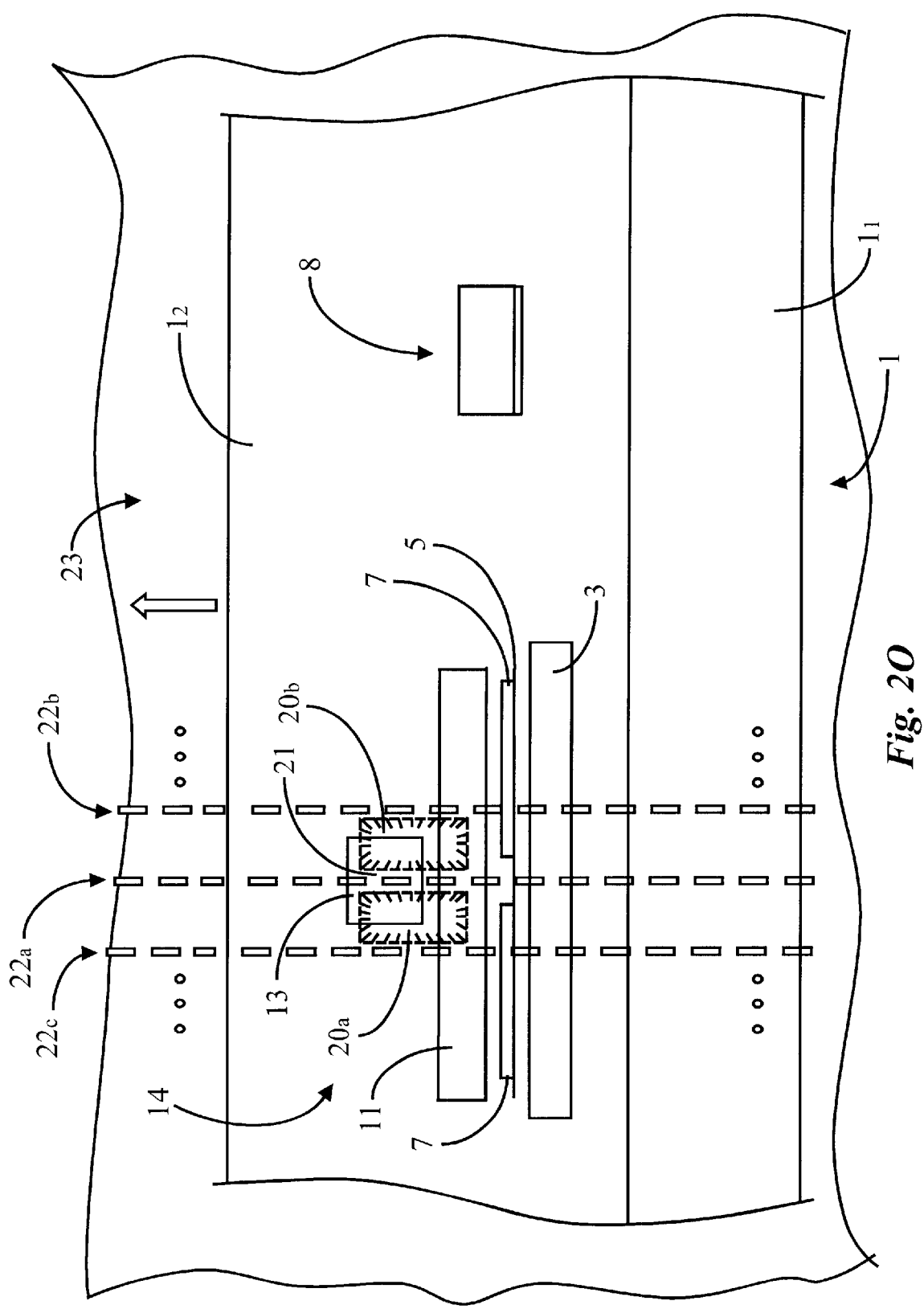

FIGS. 2A–2O are views of a second process for making and using alignment marks in accordance with this invention. FIGS. 2A–2C parallel FIGS. 1A–1C, respectively, and accordingly, a detailed description of these Figures is omitted as redundant. In FIG. 2D, a resist layer 6 is deposited on the substrate's surface and is patterned to define two windows exposing opposite sides of the MR layer 5, and two windows offset from the device 14 that is being manufactured. The resist layer 6 is hard baked to render it Insensitive to exposure by light irradiation or ion beam. The contact layers 7 and the layers 8a are formed by plating, CVD or sputtering, for example, to deposit a conductive material such as metal. In FIG. 2E, the substrate 1 is bombarded with high-energy ions 24 generated by an ion milling tool or a reactive ion etching tool to clean the side walls defining the contact layers 7 and the layers 8a. Preferably, the ions are directed at an angle with respect to the substrate's top surface as the substrate is rotated on a stage (not shown) so that all areas of the resist layers side walls are struck and thus cleaned of residual MR material by the ions. In FIG. 2F, a resist layer 25 is formed on the substrate 1. The resist layer 25 is patterned to cover the uncompleted integrated device 14 and to expose the layers 8a included in respective alignment marks 8. In FIG. 2O, the layers 8a of the alignment marks are enhanced by plating, CVD or sputtering, for example, to deposit material 8b to enlarge the size of the marks to increase their visibility to the mask alignment system to be used to form the features on the substrate's side edge. The material 8b can be metal or other material that is distinguishable by the alignment system from the substrate. In FIG. 2H, the resist layers 6, 25 are removed by a solvent, acidic solution or oxygen plasma treatment, to expose a portion of the MR layer 5, the contact layers 7, and the alignment marks 8. In FIG. 2I, insulative material 12 such as aluminum oxide ($Al_2O_3$) is grown on the substrate 1 by CVD or other technique to enclose the MR layer 5 and the contact layers 7 in the substrate 1. In FIG. 2I, a resist layer 10 is formed on the substrate 1 and patterned to define a window that exposes a portion of the substrate overlying the shield 3, the MR layer 5, and the contact layers 7. In the window defined in the resist layer 10, a conductive material is deposited by plating, CVD or sputtering, for example, to form the shared pole 11. In FIG. 2K, the resist layer 10 is removed by solvent, acidic solution or oxygen plasma treatment, for example, and an insulative material $1_2$ such as aluminum oxide is grown on the substrate 1 by CVD or other technique to enclose the shared pole 11. Also, in FIG. 2K, a resist layer $1_2$ is formed on the substrate 1 and patterned to form a window overlying the shield 3, the MR layer 5, the contact layers 7, and the shared pole 11. A conductive material such as metal is deposited by plating, CVD or sputtering, for example, on the substrate exposed by the window of the resist layer 12 to form a top pole 13. The resist layer 12 is removed by solvent, acidic solution, or oxygen plasma treatment, for example, and, in FIG. 2L, insulative material such as aluminum oxide ($Al_2O_3$) is grown on the substrate by CVD or other technique to enclose the top pole 13. In the top plan view of FIG. 2M, the substrate 1 is diced along the line 15 that traverses the alignment marks 8 and the integrated device 14 using a diamond saw, for example. The diced side edge is polished smooth with conventional devices and techniques to expose the alignment mark 8 and integrated device 14 in the side edge of the substrate 1, as shown in FIG. 2N. The substrate or rowbar is positioned in an alignment system that includes a machine vision system, along with a feature mask 16. The feature mask 16 includes a plate of fused silica that supports a layer of chromium on which a resist layer is formed. The resist layer is patterned by light irradiation or a charged particle beam to expose portions of the chrome layer. The chrome is subjected to wet-etching to remove exposed portions of the chrome layer to form mask features 17a, 17b and a mask mark 18. The feature mask 16 is moved relative to the substrate 1 as necessary to align the mask mark 18 at a predetermined distance from the alignment mark 8. Because in the second process the mark 8 has a highly regular, uniform shape with a relatively large size, the alignment system can readily detect and align the feature mask 16 to the mark 8. Upon proper positioning of the mask mark 18 over the alignment mark 8, the mask 16 defining mask features 17a, 17b is aligned relative to the integrated device exposed in the substrate's side surface. More specifically, the mask 16 is positioned properly with respect to the contact layer components of the integrated device with which the alignment marks 8 were formed. After alignment is achieved, a resist layer 19 (indicated by the dash-dot line in FIG. 2N) is exposed, typically by irradiation with light or charged particle beam, and the substrate is removed from the alignment system, developed and processed to cure the resist. The resulting resist layer 19 thus exposes two windows 17a, 17b. The substrate is subjected to ion milling with relatively high-energy ions or to reactive ion etching with ions projected with relatively high energies, to form recessed areas 20a, 20b. As shown in FIG. 2O, the two recessed areas 20a, 20b define a write gap bridge 21 situated between the two recessed areas, that is relatively narrow and that can thus be used to form relatively narrow, closely-spaced data tracks 22 on a magnetic medium 23, as shown in FIG. 2O.

Figure 3:
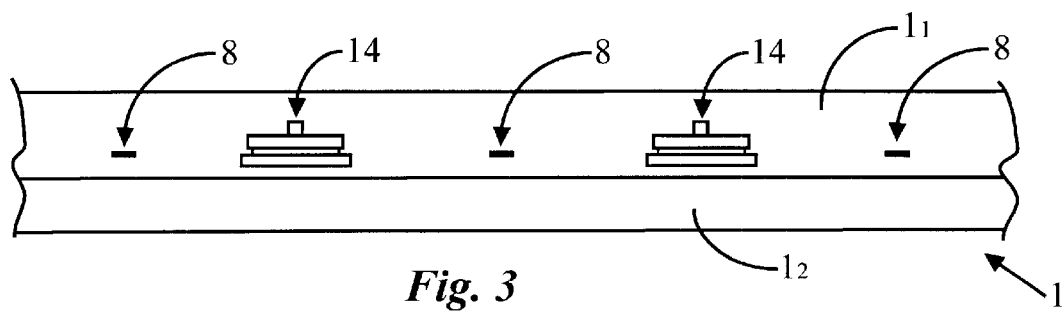
FIG. 3 is a side view of a plurality of alignment marks and integrated devices positioned at intervals in alternation on the side surface of a substrate in accordance with this invention.

FIG. 3 shows the typical rowbar or substrate 1 in which a plurality of integrated devices 14 are spaced at regular intervals across the side surface of the substrate. The alignment marks 8 are interspaced with the integrated devices 14. Although in FIGS. 1M and 2N, the alignment system and its aligning function was described with respect to a single alignment mark immediately adjacent the integrated device, in general, the more preferred practice is to align to two or more relatively widely-spaced alignment marks to form respective features in proximity to each of the integrated devices. The alignment to two or more widely spaced alignment marks generally improves the accuracy of the alignment with respect to x- and y-axes as well as the angular orientation.

Figure 4:
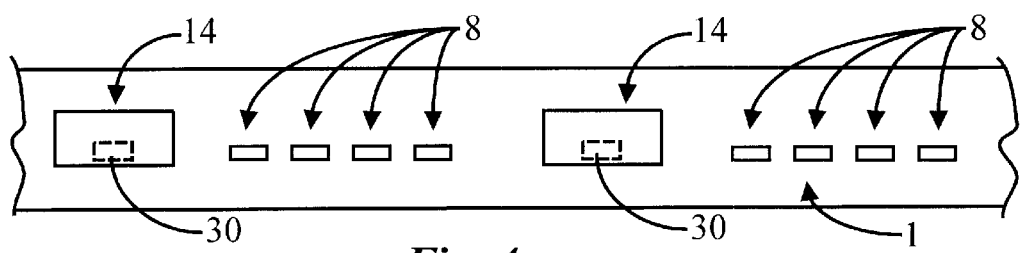
FIG. 4 is a side view of an exemplary embodiment of the subject invention in which a plurality of alignment marks are arranged at intervals in alternation with individual integrated devices.

FIG. 4 shows a variation of the invented apparatus and method in which a plurality of alignment marks 8 (four in the specific embodiment of FIG. 4) are formed at intervals in alternation with individual integrated devices 14. The provision of a plurality of marks 8 can be used advantageously to improve the capability of the alignment system to align the feature mask relative to the integrated devices' components 30 (which could, for example, be the contact layers 7 in FIGS. 1A–3) because the spaced marks generally better define x-, y- and rotational axis orientations as compared to a single mark.

Figure 5:
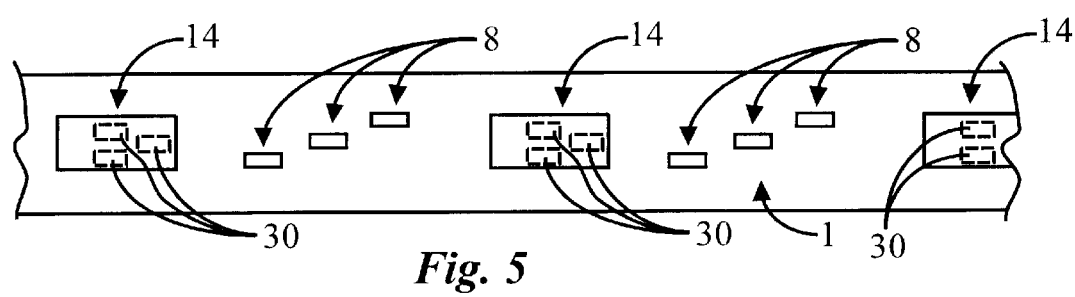
FIG. 5 is a side view of an exemplary embodiment of the subject invention in which a plurality of alignment marks are arranged at intervals in alternation with individual integrated devices.

FIG. 5 shows another variation of the invented apparatus and method in which a plurality of alignment marks 8 (three in the specific example of FIG. 5) are provided at intervals in alternation with individual integrated devices. The sets of three alignment marks are vertically displaced relative to each other in the perspective of FIG. 5, and provide positional references for respective components 30 of the integrated devices 14. Thus, the alignment marks 8 can be used for alignment of a plurality of features formed with respective masks, relative to corresponding components 30 of the integrated devices with which such marks were formed.

Figure 6:
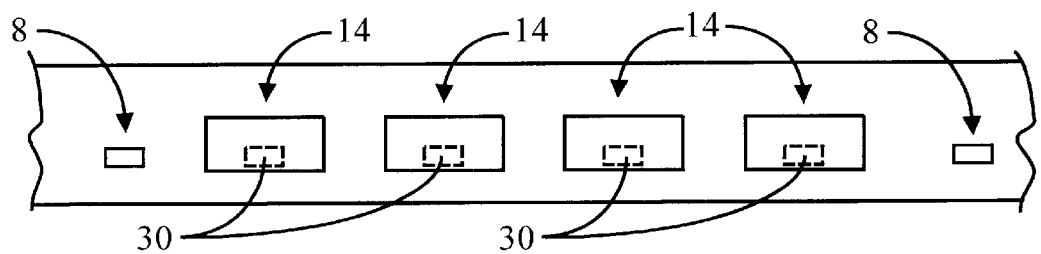
FIG. 6 is a side view of an exemplary embodiment of the invention in which alignment marks are arranged at intervals in alternation with a plurality of integrated devices.

FIG. 6 shows yet another variation of the invented apparatus and method in which alignment marks are formed at intervals separated by a plurality of integrated devices (four in the specific case of FIG. 6). In general, the exposure field of a stepper alignment and lithography system is sufficiently large to expose features relative to components 30 on four or more devices per exposure. Accordingly, the marks can be formed at intervals separated by a predetermined number of integrated devices, to align the stepper system. The stepper system can thus be stepped and aligned with the marks repetitively to expose features on integrated devices along the entire rowbar.

Figure 7:
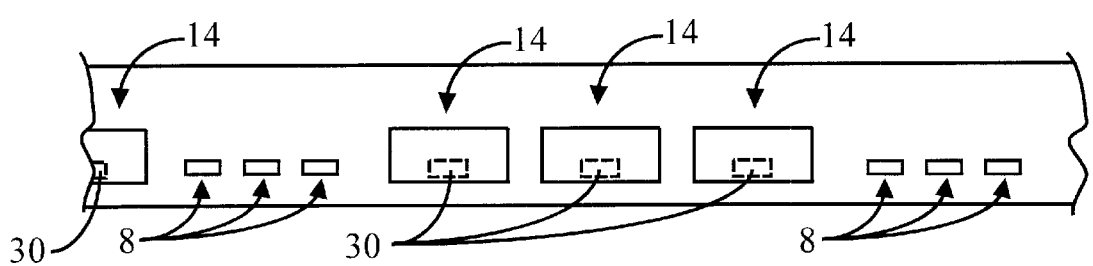
FIG. 7 is a side view of an exemplary embodiment of the invention in which a plurality of marks are provided at intervals in alternation with a plurality of integrated devices.

FIG. 7 shows another variation of the invented apparatus and method in which a plurality of alignment marks (three in the specific case of FIG. 7) are disposed at intervals in alternation with a plurality of integrated devices (three in the specific case of FIG. 7). The spaced marks can generally be used by a stepper system to improve orientation of the feature mask relative to the integrated device components 30 to which feature alignment is to be performed, since the plural marks provide increased definition of x-, y- and rotational axes compared to a single mark. A stepper system, for example, can thus be readily aligned and used to expose sets of integrated devices as it is stepped along the length of the rowbar.

It should be understood that several variations of the invented apparatus and method can be made without departing from the scope of the invention. For example, the alignment mark can be formed with other materials or techniques than those described herein so long as they are visible in the substrate's side surface so that the mask alignment system of a lithography tool can position a feature mask with such mark. Furthermore, the side alignment marks of this invention are useful not merely for thin-film read-write head devices, but for any integrated device that requires feature formation on the side, surface of a substrate in which the integrated device or a component thereof is exposed. In addition, arrangements of fewer or more alignment marks and integrated devices and respective components than those shown in the Figures can be formed on the substrate's side surface without departing from the scope of this invention.

The many features and advantages of the present invention are apparent from the detailed specification and thus, it is intended by the appended claims to cover all such features and advantages of the described apparatus and method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

We claim:

1. An apparatus for use with a mask for forming a feature on a side surface of a substrate with said side surface being exposed by dicing a wafer into at least one substrate, said side surface of said substrate being a surface other than a top, bottom and edge surface of said wafer, with said substrate having a top and bottom surface that are each a portion of the corresponding top and bottom surfaces of said wafer before dicing, the apparatus comprising:

at least one mark formed within said wafer that crosses dicing lines on said wafer with said mark fixed during formation in alignment with a device formed on the top surface of the wafer and thus the substrate after dicing with said mark visible only in the side surface of the substrate, the mark for aligning the mask used to form the feature at a predetermined position, relative to the mark, on the side surface of the substrate.

2. An apparatus as claimed in claim 1, wherein the mark is enhanced, during formation, by selective deposition of a material to increase its size.

3. An apparatus as claimed in claim 2, wherein the material includes metal.

4. An apparatus as claimed in claim 3, wherein the mark is enhanced, during formation, by plating with the metal.

5. An apparatus as claimed in claim 3, wherein the mark is enhanced, during formation, by chemical vapor deposition of the material.

6. An apparatus as claimed in claim 3, wherein the mark is enhanced, during formation, by sputtering the material.

7. An apparatus as claimed in claim 1, wherein the substrate includes an integrated device that is a magneto-resistive head, and the feature is defined by a resist layer patterned with the mask to expose portions of the magneto-resistive head to ion milling to reduce the width of a write gap of the head.

8. An apparatus as claimed in claim 1, wherein the substrate includes an integrated device that is a magneto-resistive head, and the feature is defined by a resist layer patterned with the mask to expose portions of the magneto-resistive head for reactive ion etching to reduce the width of a write gap of the head.

9. An apparatus as claimed in claim 1, wherein the substrate includes an integrated device, and the mask is used to pattern a resist layer to expose a predetermined portion of the side surface to form a conductive line on the side surface that is coupled to the integrated device.

10. An apparatus as claimed in claim 1, wherein a plurality of marks are formed at intervals and exposed only along the side surface to allow alignment of the mask used to form the feature.

11. An apparatus as claimed in claim 1, wherein a plurality of marks are formed in the substrate and exposed only in the side surface to allow alignment of a plurality respective masks used to form respective features on the side surface.

12. An apparatus for use with a first mask for patterning a feature in relation to an integrated device exposed on a side surface of a substrate with said side surface being exposed by dicing a wafer into at least one substrate, said side surface of said substrate being a surface other than a top, bottom and edge surface of said wafer, with said substrate having a top and bottom surface that are each a portion of the corresponding top and bottom surfaces of said wafer before dicing, the apparatus comprising:

at least one mark formed within said wafer that crosses dicing lines on said wafer with said mark fixed during formation in alignment with a device formed on the top surface of the wafer and thus the substrate after dicing with said mark visible and exposed only in the side surface of the substrate, the mark for aligning the first mask used to form the feature on the side surface at a predetermined position relative to the mark and the integrated device.

13. An apparatus as claimed in claim 12, wherein the mark is formed with a second mask that is simultaneously also used to form a component of the integrated device.

14. An apparatus as claimed in claim 12, wherein the mark and component are separated by a predetermined distance defined by the first mask using the position of the mark as a reference.

15. An apparatus as claimed in claim 12, wherein the mark includes metal.

16. An apparatus as claimed in claim 12, wherein the mark is enhanced, during formation, by selective deposition of a material to increase its size.

17. An apparatus as claimed in claim 16, wherein the mark is enhanced, during formation, by plating with the material.

18. An apparatus as claimed in claim 16, wherein the mark is enhanced, during formation, by chemical vapor deposition of the material.

19. An apparatus as claimed in claim 16, wherein the mark is enhanced, during formation, by sputtering of the material.

20. An apparatus as claimed in claim 12, wherein the mark has a predetermined shape defined by at least one resist layer during formation of the mark.

21. An apparatus as claimed in claim 12, wherein the integrated device includes a magneto-resistive head, and the feature is defined by a resist layer patterned with the first mask to expose portions of the magneto-resistive head for ion milling to reduce the width of a write gap of the head.

22. An apparatus as claimed in claim 12, wherein the integrated device includes a magneto-resistive head, and the feature is defined by a resist layer patterned with the first mask to expose portions of the magneto-resistive head for reactive ion etching to reduce the width of a write gap of the head.

23. An apparatus as claimed in claim 12, wherein the feature is defined by a resist layer patterned to expose portions of the side surface and integrated device to form a conductive line coupled to the integrated device.

24. An apparatus as claimed in claim 12, wherein the substrate includes a plurality of separated marks positioned at intervals in alternation with a plurality of integrated devices.

25. An apparatus as claimed in claim 12, wherein a plurality of marks are formed at intervals and exposed only along the side surface to allow alignment of the first mask used to form the feature.

26. An apparatus as claimed in claim 12, wherein a plurality of marks are formed in the substrate and exposed only in the side surface to allow alignment of a plurality respective masks used to form respective features on the side surface.

27. An apparatus as claimed in claim 12, wherein the marks are positioned at intervals during formation in alternation with a predetermined number of integrated devices.

* * * * *